US009475185B2

(12) United States Patent
Wingate et al.

(10) Patent No.: US 9,475,185 B2
(45) **Date of Patent: *Oct. 25, 2016**

(54) HAND TOOL HAVING A PIVOT GRIP FOR SENSING MEASUREMENTS BEHIND A TARGET SURFACE

(71) Applicant: Zircon Corporation, Campbell, CA (US)

(72) Inventors: Barry Wingate, San Jose, CA (US); Richard Meech Halliday, San Jose, CA (US)

(73) Assignee: ZIRCON CORPORATION, Campbell, CA (US)

(*) Notice: Subject to any disclaimer, the term of this patent is extended or adjusted under 35 U.S.C. 154(b) by 233 days.

This patent is subject to a terminal disclaimer.

(21) Appl. No.: 14/096,759

(22) Filed: Dec. 4, 2013

(65) Prior Publication Data

US 2014/0084901 A1 Mar. 27, 2014

Related U.S. Application Data

(63) Continuation of application No. 12/333,911, filed on Dec. 12, 2008, now Pat. No. 8,604,771.

(60) Provisional application No. 61/013,992, filed on Dec. 14, 2007, provisional application No. 61/105,856, filed on Oct. 16, 2008.

(51) Int. Cl.
*G01R 19/00* (2006.01)
*B25G 1/10* (2006.01)

(52) U.S. Cl.
CPC .............. *B25G 1/102* (2013.01); *Y10T 16/476* (2015.01)

(58) Field of Classification Search
None
See application file for complete search history.

(56) References Cited

U.S. PATENT DOCUMENTS

| | | | | |
|---|---|---|---|---|
| 6,249,113 | B1 * | 6/2001 | Krantz | G01V 3/15 324/67 |
| 6,681,664 | B1 * | 1/2004 | Hsien | B25G 1/105 30/340 |
| 7,193,405 | B2 * | 3/2007 | Murray | G01V 3/15 324/326 |
| 7,316,073 | B2 * | 1/2008 | Murray | G01C 15/00 33/286 |
| 8,604,771 | B2 * | 12/2013 | Wingate | B25G 1/102 324/67 |

* cited by examiner

*Primary Examiner* — Minh N Tang
(74) *Attorney, Agent, or Firm* — Silicon Valley Patent Group LLP

(57) ABSTRACT

An implementation of a system and method for a hand tool having a pivot grip is provided. The pivot grip provides an axis of rotation perpendicular to and centered with a pair of concave finger holds positioned at the grip. The hand tool includes a housing forming the pivot grip, a sensor (e.g., stud sensor, capacitive sensor, electromagnetic sensor, metallic sensor, RF sensor, and/or the like) and a power switch.

22 Claims, 8 Drawing Sheets

HAND TOOL HAVING A PIVOT GRIP FOR SENSING MEASUREMENTS BEHIND A TARGET SURFACE

CROSS-REFERENCE TO RELATED APPLICATIONS

This application is a continuation and claims the benefit, under 35 U.S.C. 120, of U.S. Pat. No. 8,604,771, to first named inventor Barry Wingate, filed Dec. 12, 2008 entitled "Hand tool having a pivot grip for sensing measurements behind a target surface", which claims the benefit under 35 U.S.C. 119(e) of U.S. Provisional Application Ser. No. 61/013,992, to first named inventor Barry Wingate, filed Dec. 14, 2007 entitled "Pivot grip", and also claims the benefit under 35 U.S.C. 119(e) of U.S. Provisional Application Ser. No. 61/105,856 to first named inventor Anthony J. Rossetti, filed Oct. 16, 2008 and entitled "Dynamic information projection for a wall sensor", all of which are incorporated herein by reference in their entirety.

BACKGROUND OF THE INVENTION

1. Field of the Invention

The invention relates generally to hand tools and more specifically to a hand tool having a pivot grip.

2. Background of the Invention

Hand tools such as stud sensor that one slides across a target surface often have handles or grips positioned for an operator to use the hand tool in a fixed orientation with respect to the operator and the target surface. Typical hand tools include a grip and a power button, which is depressed during operation to provide power to internal circuitry. The sides of existing hand tool grips are either convex outward or vertical/flat. The power buttons of existing hand tools are square, oval or oblong. Some existing hand tools include running boards to prevent an operator from dragging a finger along the target surface.

However, the above described conventional hand tools fail to allow for comfortable positioning among various orientations of a target surface, such as a floor below the operator, wall in front of the operator and ceiling above the operator. Therefore, a need exists for a more comfortable hand tool having a grip that allows for easier positioning among various target surface orientations.

SUMMARY

Some embodiments of the present invention provide for a hand tool for sensing a measurement behind a target surface, the hand tool comprising: a housing; a sensor coupled in the housing; and a grip having a pair of concave finger holds positioned at opposite sides of the grip to provide an axis of rotation.

Some embodiments of the present invention provide for a method for using a hand tool against target surfaces, wherein the hand tool comprises a grip having a pair of concave finger holds positioned on the grip to provide an axis of rotation, the method comprising: providing the hand tool; holding the hand tool with a thumb at a first concave finger hold of the pair of concave finger holds and with a finger at a second concave finger hold of the pair of concave finger holds; positioning the hand tool against a first target surface; and rotating the hand tool about the axis of rotation relative to the finger and thumb.

Some embodiments of the present invention provide for a hand tool for sensing a measurement behind a target surface, the hand tool comprising: a housing comprising a first indicator and a slit to allow light to pass through; a sensor coupled to the housing; and a first LED coupled to the sensor; wherein the first LED, when illuminated, backlights the first indicator and spotlights the target surface through the slit.

Embodiments of the present invention are also described below and shown in the drawings. These and other aspects, features and advantages of the invention will be apparent from reference to the embodiments described hereinafter.

BRIEF DESCRIPTION OF THE DRAWINGS

Embodiments of the invention will be described, by way of example only, with reference to the drawings.

DETAILED DESCRIPTION OF THE INVENTION

In the following description, reference is made to the accompanying drawings, which illustrate several embodiments of the present invention. It is understood that other embodiments may be utilized and mechanical, compositional, structural and operational changes may be made without departing from the spirit and scope of the present disclosure. The following detailed description is not to be taken in a limiting sense.

A hand tool having a pivot grip, in accordance with embodiments of the present invention, may be for sensing a measurement behind a target surface. The pivot grip provides an axis of rotation perpendicular and centered with a pair of concave finger holds positioned at the grip. The hand tool includes a housing or housing means. The housing or housing means may be a plastic housing formed by injection molding two or more components, which are assembled during manufacturing. The hand tool also includes a sensor or sensing means mounted in the housing. The sensor or sensing means may be a capacitive sensor, electromagnetic sensor, stud sensor, metallic sensor, RF sensor, or the like mounted to the interior of the housing.

The hand tool also includes a pivot grip or griping means. The pivot grip or griping means includes pair of concave finger holds positioned at opposite sides of the grip to provide the axis of rotation. A first finger hold may be used for either positioning an operator's finger such as an index finger or positioning the operator's thumb. The second finger hold may be used for positioning the other finger or thumb of the same hand of the operator. As a result, the pivot grip (also called a grip) provides for ergonomic handling of the hand tool, which may easily be repositioned for mixed use against walls, ceilings and floors, for example, to scan for studs. Furthermore, the "shoe sole" form feature that partially surrounds the end of the hand tool may represent the positioning of the sensor plate and active end of the hand tool.

The grip (or pinch grip for use between a thumb and a forefinger) requires little conscious effort to maintain the grip. It may seem to rest in the hand when scanning vertical and overhead surfaces. The opposing digits rest in opposing concave recesses, so formed that the hand tool may pivot freely between the fingers to follow the surface to be scanned. This provides a pivotable, comfortable, secure, hold on the hand tool housing regardless of its orientation to the operator.

The hand tool may also include a switch or switching means. The switch or switching means may be a mechanical switch or non-mechanical switch and may be positioned in a single or both concave recesses as described below.

Figure 1:
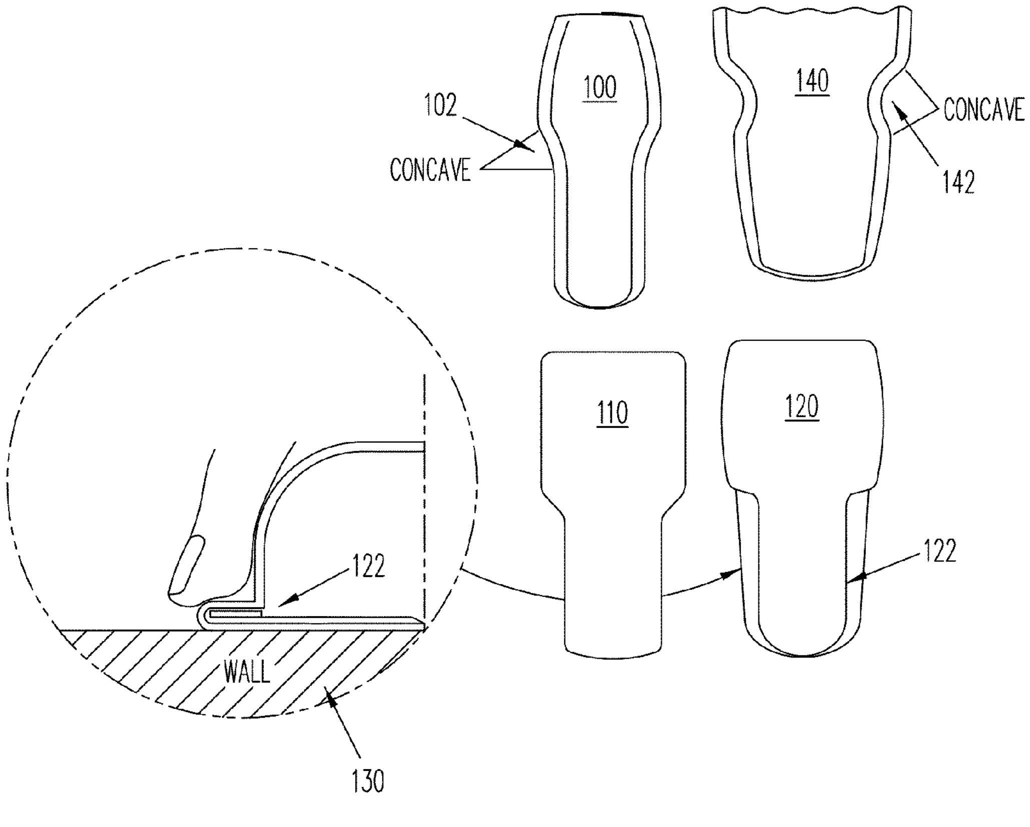
FIG. 1 shows top down views of various hand held tools.

FIG. 1 shows top down views of various hand held tools, such as a stud sensor or other sensing tool. A first sensing tool 100 includes a concave portion 102 that provides resting positions for an operator's thumb and index finger. A second sensing tool 110 provides a convex portion that provides similar resting positions for the operator's thumb and index finger. Either sensing tool 100 or 110 may be augmented with a running board 122 to provide thumb and finger support and to isolate the thumb and fingers from a wall 130. A third sensing tool 120 includes such a running board 122. A fourth sensing tool 140 also includes concave portions 142 that provide resting positions for an operator's thumb and index finger. None of these sensing tools, however, provide a pivoting grip and each have encumbrances when an operator changes a relative positioning between the hand tool sensing tool and the operator's arm.

Figure 2A:
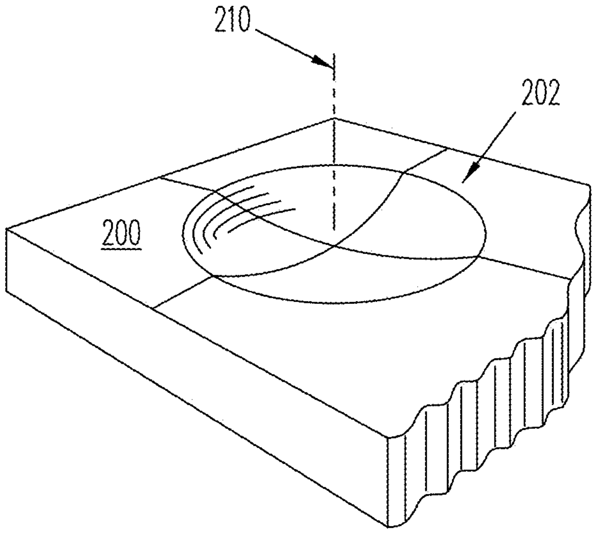
FIGS. 2A and 2B show a pivot impression from half of a pivot grip, in accordance with embodiments of the present invention.
Figure 2B:
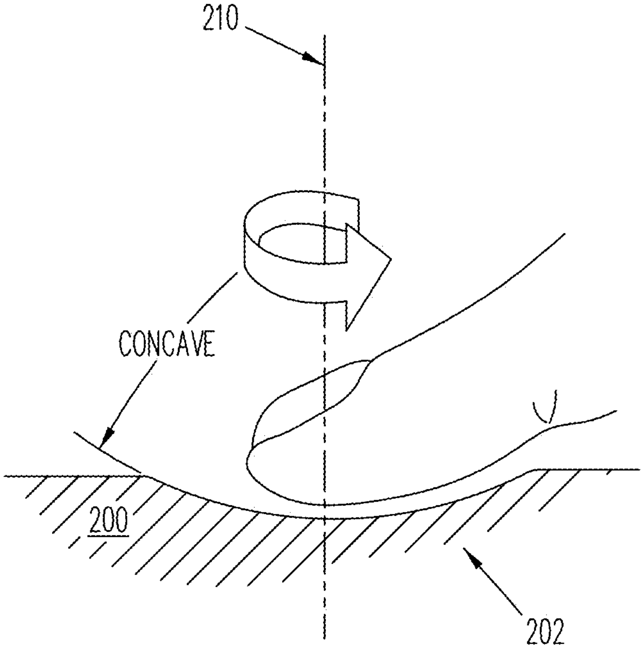

FIGS. 2A and 2B show a pivot impression from half of a pivot grip, in accordance with embodiments of the present invention. FIG. 2A shows a perspective view of part of a pivot grip. One way of defining a shape of a finger hold is to press a finger or thumb into a block of clay and rotate the clay relative to the finger or thumb while applying a force between the finger or thumb and the block of clay. The resulting clay block will now have a three-dimensional concave depression. The concave finger holds provide ergonomic hand positioning.

This concave depression may be viewed as a first three-dimensional concave arch along the x-axis and a second three-dimensional concave arch along the y-axis, where the finger or thumb was rotated about the z-axis of a three-dimensional Cartesian coordinate system. The concave arch (from a cross-sectional view) may define an arch with a constant radius thereby defining a segment of a circle. If both x-axis and y-axis arches provide a constant arch having a common radius, then the impression will define a partial surface area of a sphere (three-dimensional circle). If the x-axis and y-axis arches provide two different arches having different radiuses, then the impression will define a partial surface area of an ovoid (egg shaped or three-dimensional oval) or prolate or oblate spheroid (three-dimensional ellipse rotated about the ellipse's major or minor axis, respectively). Alternatively, the concave depression may be generally opened on one end of the depression (e.g., see FIG. 7).

A pair of finger holds forms a pivot grip and also defines an axis of rotation 210. The pivot grip is formed when an operator holds a hand held tool in a pitching manner between a thumb and a finger. The axis of rotation 210 is defined by two points closest to each other where one point resides on each surface. These two points also identify where the two surfaces are parallel to each other and also directly facing one another. An imaginary line drawn between these two points identifies an axis of rotation 210 between the tool and an operator's hand. The operator rotates about this axis of rotation 210 when using the tool along a surface or when re-positioning the tool between different surfaces.

The finger holds (or pinch grips) are concave formed depressions in the hand tool that allow the operator to pinch the hand tool between a thumb and a finger. The pair of finger holds provides a pivotable, comfortable and secure hold on the hand tool when held against various target surfaces. For example, the hand tool may be a hand held scanner such as a stud sensor, alternating current (AC) sensor, metal sensor and the like. For effective and efficient use of a hand tool such as a scanner, an operator's thumb and figures should be kept away from any sensor plates. These sensor plates may be placed in the front half of the scanner and parallel to the to-be scanned target surface. Wiring, LEDs and traces should also be kept away from the sensor plates.

An operator may use the hand tools against various target surfaces. The hand tool includes a grip having a pair of concave finger holds positioned on the grip to provide an axis of rotation 210. The operator holds the hand tool with a thumb at a first concave finger hold of the pair of concave finger holds and with a finger at a second concave finger hold of the pair of concave finger holds. The operator then positions the hand tool against a first target surface, such as a wall. For the operator to scan a ceiling, the operator rotates the hand tool about the axis of rotation 210 relative to the finger and thumb to orient the hand tool for a second target surface (e.g., the ceiling). Next, the operator slides the hand tool along the surface or re-positions the hand tool against the second target surface. The first and second target surfaces may be perpendicular or parallel to each other. The operator may then rotate the hand tool about the axis of rotation 210 relative to the finger and thumb to orient the hand tool for a third target surface. The operator then re-positions the hand tool against the third target surface.

Figure 3A:
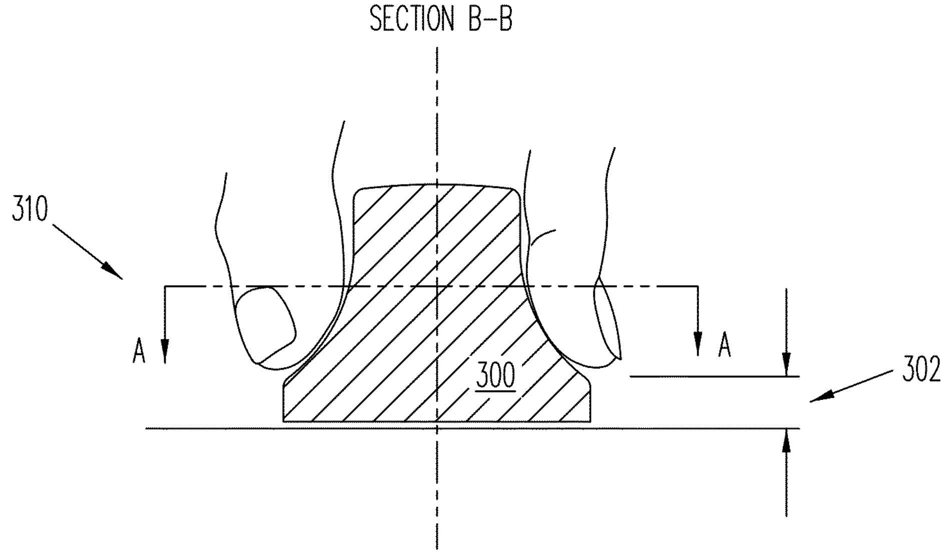
FIGS. 3A and 3B show a front view and a top view of a hand held tool grip, in accordance with embodiments of the present invention.
Figure 3B:
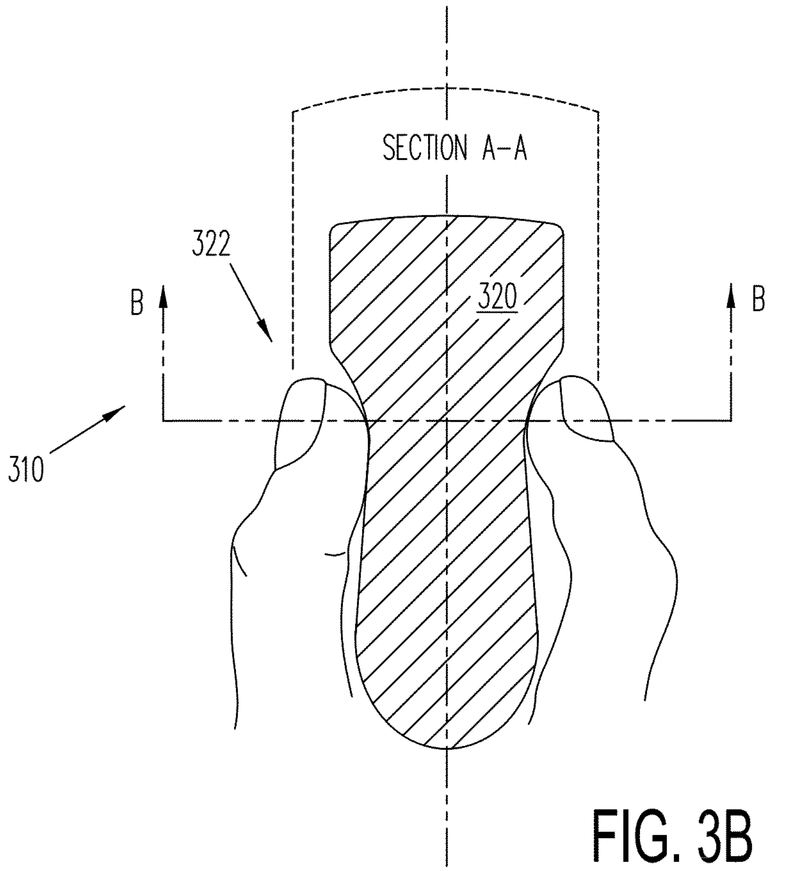

FIGS. 3A and 3B show a front view 300 and a top view 320 of a hand held tool grip, in accordance with embodiments of the present invention. In this variation of the grip of a hand tool, the prototype shown includes concave finger holds that are concave along the front of the finger hold but tapered out to be less concaved towards the back of the finger hold. The grip provides an axis of rotation 310 and also provides the function of a running board by distancing the thumb and finger from the surface at points 302 and 322.

FIG. 3A shows a front cross sectional view 300 where the concave finger holds act to provide running board functionality to inhibit an operator's finger and thumb from inadvertently touching the target surface. That is, a finger ledge or running board helps press the sensing tool to the scanned surface and prevent the fingers scraping the target surface, such as a wall 130 from FIG. 1. This feature is integrated and enhanced in the pinch grip with a more comfortable, finger friendly curvature with fingernail clearance.

Figure 4:
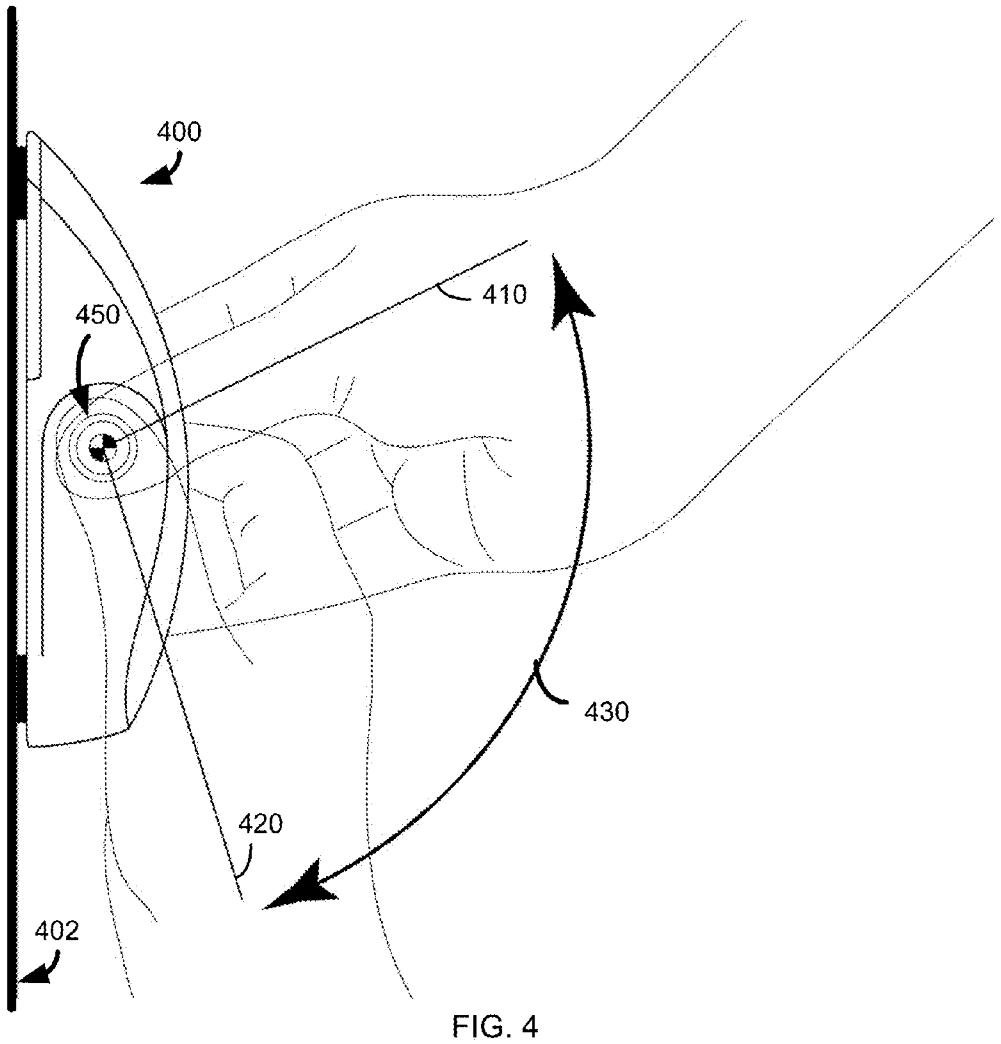
FIGS. 4 and 5 show a hand tool being held by an operator, in accordance with embodiments of the present invention.
Figure 5:
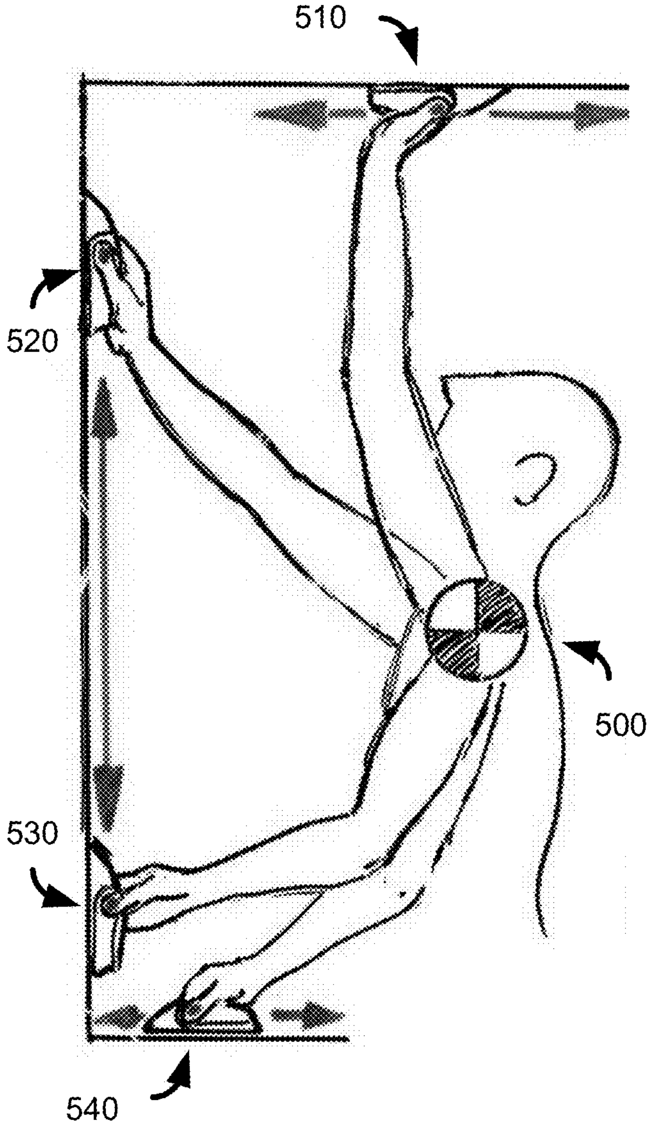

FIGS. 4 and 5 show a hand tool being held by an operator, in accordance with embodiments of the present invention. FIG. 4 shows a side view of hand placement relative to a sensing tool 400 when the hand tool is held in a vertical position against a wall 402 or other vertical surface. The convex finger holds allow for various relative positioning of a hand. In a first position, the tool 400 and hand form a first relative angle 410. In a second position, for example, further up the wall 402, the tool 400 and hand form a second relative angle 420. The concave grip provides for a large range of relative angles 430 between these to positions. The large range of relative angles 430 allows for comfortable handling and control of the tool 400 about an axis of rotation 450.

FIG. 5 shows a side view of a hand placement relative to hand held sensing tool when the hand tool is held in various vertical and horizontal positions. In a first position 510 on a first horizontal surface, the tool and the hand are shown to form a first relative angle (e.g., angle 410 from FIG. 4). As the operator pushes the tool away, the tool and the hand may form a second relative angle (e.g., angle 420 from FIG. 4). The operator may move the tool from the first horizontal surface to a vertical surface to a second position 520 where the tool and the hand are again shown to form the first relative angle. Sliding the tool from the second position 520 to a third position 530 forms the second relative angle between the tool and the hand. Repositioning the tool from the vertical surface to a second horizontal surface to a forth position 540 is shown to reset the relative angle between the operator and tool to the first relative angle. Such relative angles are provide as examples only and are not intended to be limiting.

Figure 6A:
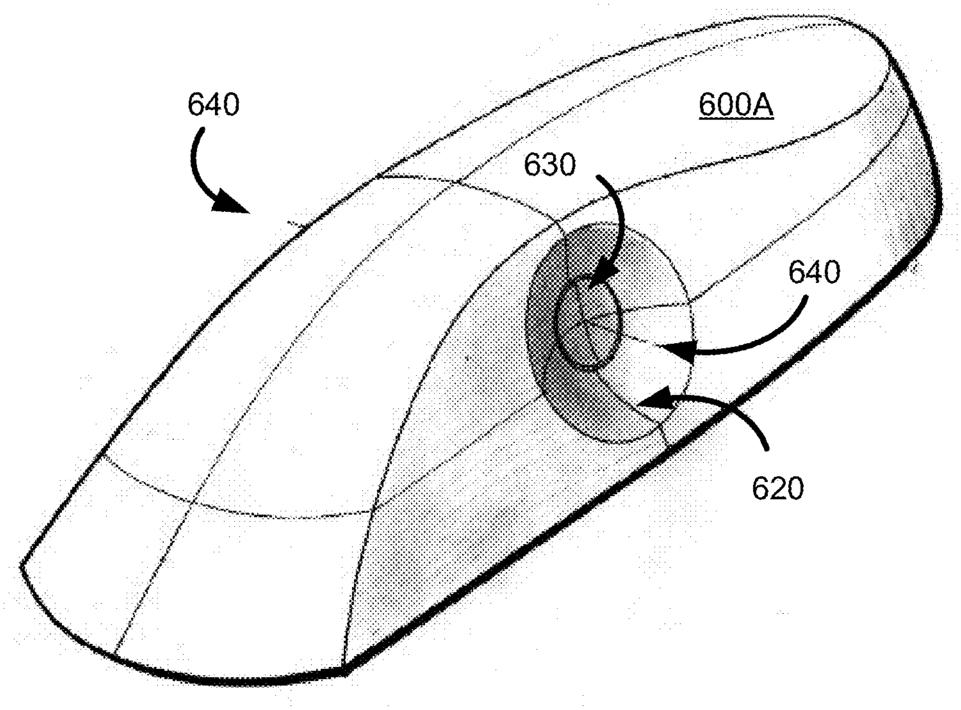
FIGS. 6A, 6B and 7 show a hand tool including a pivot grip and power switch, in accordance with embodiments of the present invention.
Figure 6B:
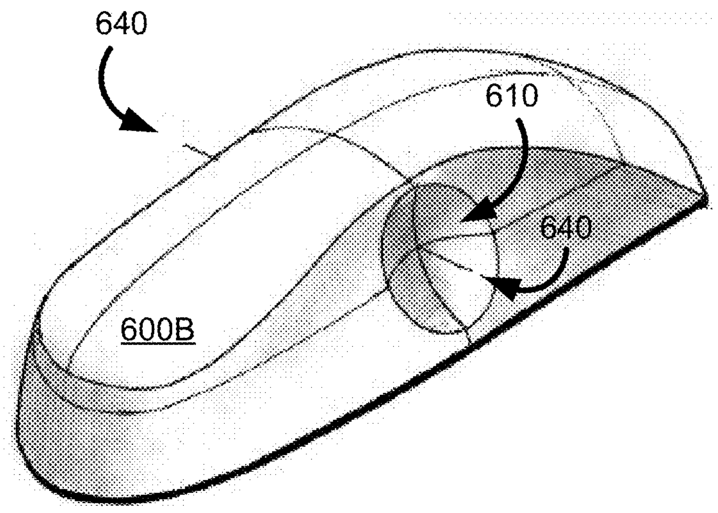
Figure 7:
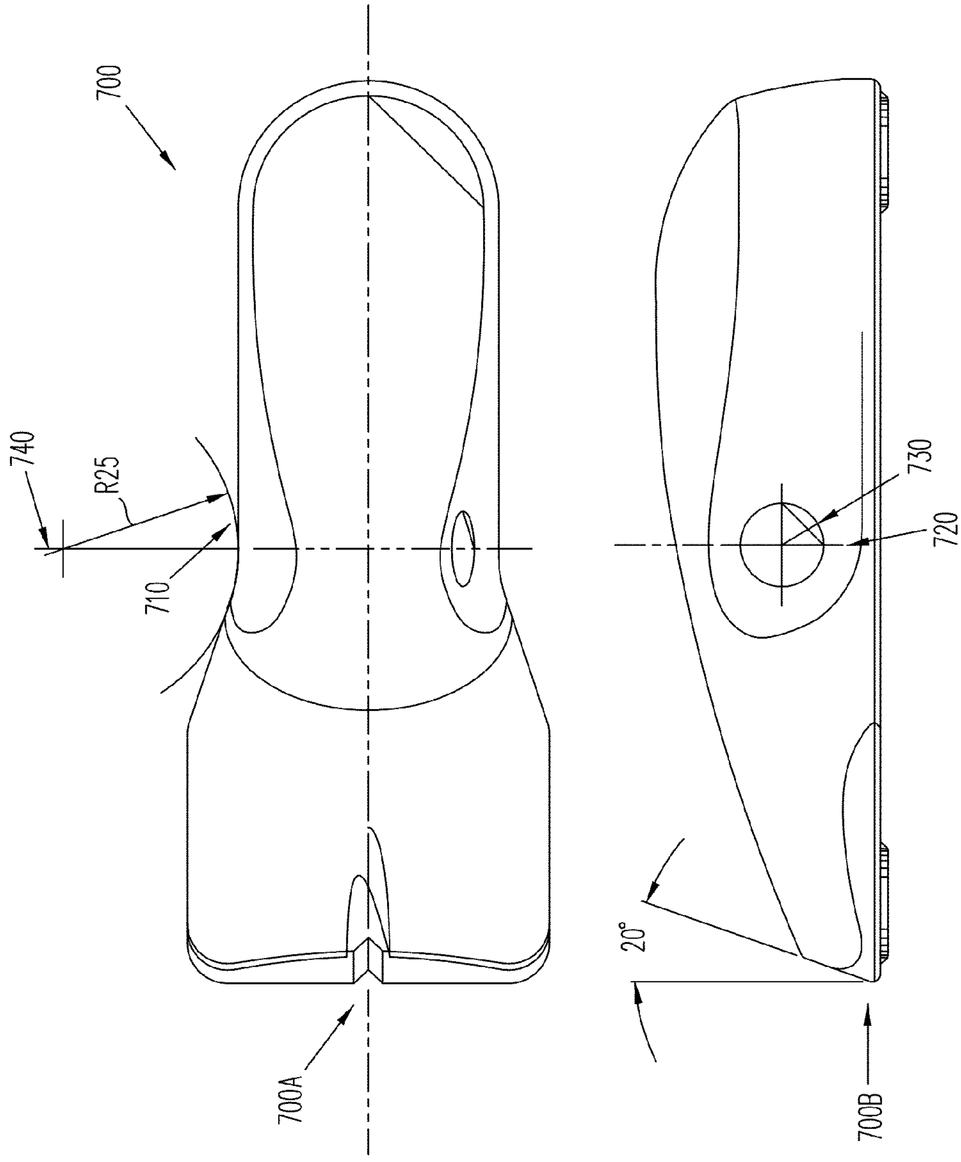

FIGS. 6A, 6B and 7 show a hand tool 600 including a pivot grip 620 and power switch 630, in accordance with embodiments of the present invention.

FIGS. 6A and 6B show a back perspective view 600A and a front perspective view 600B, respectively. The hand tool 600 includes a left concave finger hold 610 and a right concave finger hold 620, which may each form a symmetric surface. Alternatively, a concave finger hold may be asymmetrical. The pair of concave finger holds provides an axis of rotation 640.

The left concave finger hold 610 is shown to have an integrated power switch 630, which is formed to continue the concave nature of the finger hold. In some embodiments, the tool includes a mechanical power switch built into one of the two concave finger holds (as shown). In operation, an operator pitches the tool at the finger holds thereby depressing the mechanical power switch and energizing the tool for operation. Alternatively, the tool utilizes a conventional power switch apart from the finger holds. For example, a switch is positioned on an exterior face of the tool. Alternatively, a non-mechanical switch is employed. For example, a motion sensing switch may be used such that when the tool is moved, it is energized for a predetermined period of time. Alternatively, the pair of concave finger holds may each include a sensor to detect the presences of a finger. For example, the tool may include an isolated conductive plate at each concave finger hold and circuitry to measure a resistance or capacitance between the two conductive plates. Alternatively, the two isolated conductive plates may be positioned in one of the two finger holds such that an operator's finger completes a circuit or alters an electrical characteristic detectable by the tool.

FIG. 7 shows an additional model of a hand tool, in accordance with embodiments of the present invention. The drawings show relative dimensions of a hand tool from a top-down view 700A and a side view 700B. The hand tool includes a right concave finger hold 710 and a left concave finger hold 720 with integrated switch 730. In some embodiments, the right concave finger hold 710 and left concave finger hold 720 are both shaped with a common radius. In other embodiments, the finger holds have different radiuses. For example, the right finger hold 710 may be deeper than the left finger hold 720 (or vice versa). The finger holds 710 and 720 define an axis of rotation 740.

Figure 8:
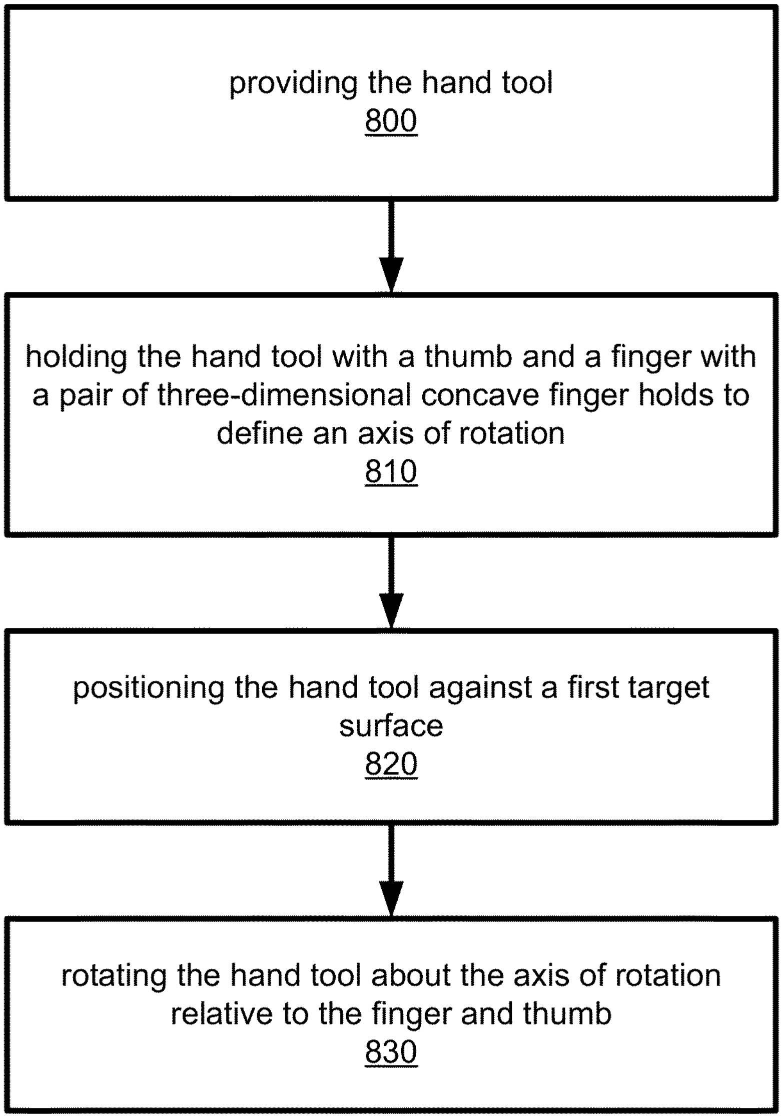
FIG. 8 describes a process of using a hand tool including a pivot grip, in accordance with embodiments of the present invention.

FIG. 8 describes a process of using a hand tool including a pivot grip, in accordance with embodiments of the present invention. The hand tool, which includes a grip having a pair of three-dimensional concave finger holds positioned on the grip to provide an axis of rotation, is used against target surfaces. At 800, the hand tool is provided. At 810, an operator holds the hand tool with a thumb and a finger. The thumb is positioned at a first three-dimensional concave finger hold of the pair of three-dimensional concave finger holds to define an axis of rotation. Similarly, the finger is positioned at a second three-dimensional concave finger hold of the pair of three-dimensional concave finger holds. In this manner, the operator may allow the hand tool to pivot relative to the operator's hand. The action of holding or pinching the hand tool between the thumb and finger may trigger a switch and energize the hand tool. The switch may be mechanical or non-mechanical and may use employ either a single finger hold or both finger holds as described above.

At 820, the operator positions the hand tool against a first target surface. The target surface may be a wall, ceiling, floor or the like. Steps 810 and 820 are interchangeable in order. At 830, the operator allows the hand tool to rotate about the axis of rotation relative to the finger and thumb. For example, the operator may slide the hand tool along the surface thereby extending or contracting the operator's reach, which allows the hand to rotate freely about the axis of rotation. Alternatively, the operator may re-position the hand tool to orient the hand tool for a second target surface and similarly allow the hand tool to rotate about the axis of rotation. This process may continue when the operator re-positions the hand tool against the second target surface. The target surfaces may be perpendicular or parallel to each other. By allowing the operator to more comfortably rotate the hand tool about the axis of rotation, the hand tool may readily detect and indicate the presence of a hidden object behind one of the target surfaces.

Therefore, it should be understood that the invention can be practiced with modification and alteration within the spirit and scope of the appended claims. For example, the pivot grip may be used with other hand tools as well, such as a handle on a paint pad, a cleaning tool or other tool having a handle that one used on perpendicular planer surfaces. The description is not intended to be exhaustive or to limit the invention to the precise form disclosed. It should be understood that the invention can be practiced with modification and alteration.

What is claimed is:

1. A stud finder for sensing a measurement behind a target surface, the stud finder comprising:
- a housing;
- a sensor coupled in the housing; and
- only two depressed finger holds positioned at opposite sides of a grip allowing pivoting to provide an axis of rotation.

2. The stud finder of claim 1, further comprising:
- a power button;
- wherein the power button is positioned in one of the two depressed finger holds.

3. The stud finder of claim 1, further comprising a finger ledge.

4. The stud finder of claim 3, wherein the finger ledge distances a thumb and a finger from scraping the target surface.

5. The stud finder of claim 1, further comprising a running board.

6. The stud finder of claim 5, wherein the running board isolates a thumb and a finger from the target surface.

7. The stud finder of claim 5, wherein the running board distances a thumb and a finger from the target surface.

8. The stud finder of claim 5, wherein the running board inhibits a thumb and a finger from inadvertently touching the target surface.

9. The stud finder of claim 5, wherein the running board provides a barrier between:

a thumb and a finger; and the target surface.

10. The stud finder of claim 1, wherein the housing forms an acute angle at a front edge in a side view for a side comprising one of the two depressed finger holds.

11. The stud finder of claim 10, wherein the acute angle is 70 degrees or less.

12. The stud finder of claim 10, wherein the acute angle is between 30 and 45 degrees.

13. The stud finder of claim 1, wherein the housing forms a V-notch at a center of a front side in a top-down view.

14. A stud finder for sensing a measurement behind a target surface, the stud finder comprising:

housing means for providing a housing to the stud finder;

sensing means for sensing a hidden characteristic, wherein the sensing means is coupled in the housing means;

gripping means for gripping and for providing an axis of rotation, wherein the gripping means comprises only two depressed finger holds positioned at opposite sides allowing pivoting to provide an axis of rotation; and a running board means to distance a thumb and a finger from the target surface.

15. The stud finder of claim 14, further comprising a switching means, within the gripping means, to energize the stud finder.

16. The stud finder of claim 14, further comprising a finger ledge means to distance a thumb and a finger from scraping the target surface.

17. A method for using a stud finder against target surfaces, wherein the stud finder comprises a grip having only two depressed finger holds allowing pivoting to provide an axis of rotation, the method comprising:

providing the stud finder with the only two depressed finger holds;

holding the stud finder with a thumb at a first depressed finger hold of the two depressed finger holds and with a finger at a second depressed finger hold of the two depressed finger holds;

positioning the stud finder against a first target surface; and rotating the stud finder about the axis of rotation relative to the thumb and the finger.

18. The method of claim 17, further comprising re-positioning the stud finder against a second target surface.

19. The method of claim 17, further comprising:

rotating the stud finder about the axis of rotation relative to the thumb and the finger to orient the stud finder for a third target surface;

re-positioning the stud finder against the third target surface.

20. The method of claim 17, further comprising:

detecting a hidden object behind the first target surface; and indicating to an operator detection of the hidden object.

21. The method of claim 17, wherein holding the stud finder comprises energizing the stud finder with at least one of the thumb and the finger using one of the two depressed finger holds.

22. The method of claim 17, further comprising distancing the thumb and the finger from the target surfaces with a running board.

* * * * *